(12) United States Patent
Chow et al.

(10) Patent No.: US 6,393,021 B1
(45) Date of Patent: May 21, 2002

(54) INTEGRATED MULTIPORT SWITCH HAVING SHARED DATA RECEIVE FIFO STRUCTURE

(75) Inventors: Peter Ka-Fai Chow; Thomas J. Runaldue, both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/992,815

(22) Filed: Dec. 18, 1997

Related U.S. Application Data

(60) Provisional application No. 60/038,025, filed on Feb. 14, 1997.

(51) Int. Cl.[7] .................. H04Q 11/00; H04L 12/66; G06F 12/00
(52) U.S. Cl. ............. 370/378; 370/381; 370/428; 370/463; 711/100
(58) Field of Search .................. 370/376, 378, 370/422, 423, 425, 407, 412, 463, 415, 417, 428, 381–383, 379, 424; 375/372; 711/100, 104–106, 202–203, 212, 220; 712/239

(56) References Cited

U.S. PATENT DOCUMENTS

| | | | |
|---|---|---|---|
| 5,271,002 A | 12/1993 | Barri et al. | |
| 5,515,376 A | 5/1996 | Muthy et al. | |
| 5,519,708 A | 5/1996 | Van Der Veen | |
| 5,828,835 A | * 10/1998 | Isfeld et al. | 395/200.3 |
| 5,854,921 A | * 12/1998 | Pickett | 712/239 |
| 5,991,308 A | * 11/1999 | Fuhrmann et al. | 370/395 |
| 6,119,213 A | * 9/2000 | Robbins | 711/220 |

FOREIGN PATENT DOCUMENTS

| | | |
|---|---|---|
| EP | 0 299 473 A3 | 1/1989 |
| EP | 0 363 053 A3 | 4/1990 |

OTHER PUBLICATIONS

"A Multi–Functional Large–Scale ATM Switch Architecture", M. Takatori et al., ISS '95 Symposium, VDE, Apr. 23, 1995, vol. 1, No. 15, pp. 489–493.

* cited by examiner

*Primary Examiner*—Wellington Chin
*Assistant Examiner*—Maikhanh Tran

(57) ABSTRACT

An integrated multiport switch (IMS) having a receive FIFO structure with a single port RAM, for storing network communication data received from each port of the switch. The RAM is connected to a FIFO control unit, which is coupled to a MAC for each port by a MAC bus, by a FIFO memory input bus. Writing of data received from each port via the MAC bus to the RAM is controlled on a time shared basis. The FIFO control unit includes a receive RAM interface that is connected to the MAC bus for receiving communication data from the ports and to the FIFO memory input bus for transferring communication data to the RAM for temporary storage. As the FIFO memory input bus has a larger bit transfer capacity than the MAC bus, the receive RAM interface can accumulate incoming data during clock cycles in which data is being read from the single port RAM. When the accumulated data for a given port is to be written to the RAM in a subsequent write cycle, it is then combined with additional incoming data for the same port received at that time for transfer to the RAM.

9 Claims, 7 Drawing Sheets

INTEGRATED MULTIPORT SWITCH HAVING SHARED DATA RECEIVE FIFO STRUCTURE

CROSS-REFERENCE TO RELATED APPLICATION

This application claims priority from provisional patent application Ser. No. 60/038,025, filed Feb. 14, 1997, the entire disclosure of which is hereby incorporated by reference herein.

Some of the subject matter disclosed in this application is similar to subject matter disclosed in application Ser. No. 08/992,921, filed Dec. 18, 1997, now U.S. Pat. No. 6,094,436.

TECHNICAL FIELD

The present invention relates to network switching and, more particularly, to time shared use of common receive FIFO structure in a data network switch logic chip.

BACKGROUND ART

A data network switch permits data communication among a plurality of media stations in a local area network. Data frames, or packets, are transferred between stations by means of data network switch media access control (MAC) circuitry at each switch port. The MAC supervises transmission of data traffic from the port to the network, the reception of data traffic at the port from the network, and mediates data traffic at the port to avoid collisions. Transmit and receive FIFO buffers at each port are coupled to the MAC to hold frame data temporarily.

The network switch passes data frames received from transmitting stations to destination stations based on the header information in the received data frames. The header information in each received frame may identify a single destination or contain a virtual destination address that identifies multiple destinations to which the frame data are to be transmitted. In the latter case, copies of the frame data are output to a plurality of ports associated with the destination stations. In a broadcast transmission mode, all stations on the network are to receive the frame data. Frame data can also be transmitted to a destination in another network, which is indicated by a VLAN destination address.

Depending upon mode of operation, an incoming frame, temporarily held in a receive FIFO, may be moved to memory external to the switch for later transmission or placed in the transmit FIFO of the appropriate port for immediate transmission out to the network. The receive FIFO passes frame header information to a rules checker that will identify the appropriate output MAC port(s) for the frame data. The rules checker, which contains information to map destination addresses to MAC ports, may be embodied in a switch logic chip or located externally to the chip.

The receive FIFO for each port thus is capable of holding incoming data, while sending header information data to the rules checker for identification of the transmission output ports, and transferring the held data to external memory for subsequent transmission to the network. The FIFO at each port must contain sufficient register capacity and control circuitry to perform this functionality. As switch development has evolved, the switch logic elements have been integrated into a single chip. In order to provide greater traffic flow capacities and increased number of switch ports in the service of increasingly robust data networks, the need for efficient use of chip architecture becomes critical. The number of MACs and FIFOs required increases with each additional port. The storage capacity of each FIFO, as well as the control logic therefor, must also be increased as traffic flow control becomes more complex.

A description of the increased MAC complexity and its resulting demand on chip architecture is contained in the aforementioned commonly assigned copending application, Ser. No. 08/992,921. That problem is addressed by providing one combinational logic and register arrangement for executing similar MAC functions for the plurality of switch ports. The common circuitry, which primarily performs logic operations, at any given time is appropriately associated with the respective port for which MAC functions are required.

The time shared common MAC circuitry described in the aforementioned application frees up chip space by eliminating similar elements at each port that would provide redundant functionality. The need remains for increasing the efficient use of receive FIFO resources. The FIFOs must store and transfer increasingly larger volumes of communication data, which demand a greater proportion of chip area. An effort to improve efficiency of chip allocation to FIFO resources would present challenges that include managing a potentially constant stream of data from all ports that must be appropriately buffered and transferred without overflow or loss. The transfer of data out of the FIFO must occur in periods during which new data is being received from MAC ports. Consolidation of FIFO architecture to meet these needs would involve precise determination of different levels of data flow capacities among various elements of the FIFO structure. Accurate timing of various stages of FIFO control, with some functions occurring concurrently, would be required for the orderly flow of data. FIFO functions are complicated by the need to transfer frame data both to external memory and to a rules checker for mapping the frame data to appropriate switch output ports.

DISCLOSURE OF THE INVENTION

The present invention addresses the above noted needs and drawbacks of current network switches in part by providing a single receive FIFO for a plurality of ports of the multiport switch so that redundant duplication of FIFO structure at each port is eliminated. Data received at each port is transferred to the FIFO on a time shared basis, each port having a designated time slot in a complete sequence of clock cycles. This staged input pipeline to the receive FIFO is synchronized to a sufficiently high clock rate to effectively handle the received data. The invention thus provides more efficient use of chip resources and architecture space than prior art conventional devices.

Another aspect of the invention involves a receive FIFO structure having a single port RAM, for storing network communication data received from each port of the switch. The RAM is connected to a FIFO control unit, which is coupled to a MAC for each port by a MAC bus, by a FIFO memory input bus. Writing of data received from each port via the MAC bus to the RAM is controlled on a time shared basis. In an alternative embodiment, the MAC bus may be coupled to a shared media access control circuitry such as disclosed in the above-identified copending application.

The FIFO control unit includes a receive RAM interface that is connected to the MAC bus for receiving communication data from the ports and to the FIFO memory input bus for transferring communication data to the RAM for temporary storage. As the FIFO memory input bus has a larger bit transfer capacity than the MAC bus, the receive RAM interface can accumulate incoming data during clock cycles in which data is being read from the single port RAM. When the accumulated data for a given port is to be written to the RAM in a subsequent write cycle, it is then combined with additional incoming data for the same port received at that time for transfer to the RAM.

The FIFO control unit is coupled to the RAM by a FIFO memory output bus for transferring data read from the RAM to first and second slave state machines in the FIFO control unit. The first slave state machine receives frame data for output over a data bus to external memory. The second slave state machine receives frame header information data for output over a rules checker bus to a rules checker. The memory output bus has a significantly larger bit transfer capacity than the data bus and the rules checker bus, whereby data can concurrently be transferred by both state machines to the external memory and the rules checker. The transfer of data out from the state machines can take place during both write and read cycles of the single port RAM because of the large bit transfer capacity of the memory output bus. As this capacity is also larger than the FIFO memory input bus to the RAM, the likelihood of RAM data overflow is minimized.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

BEST MODE FOR CARRYING OUT THE INVENTION

Figure 1:
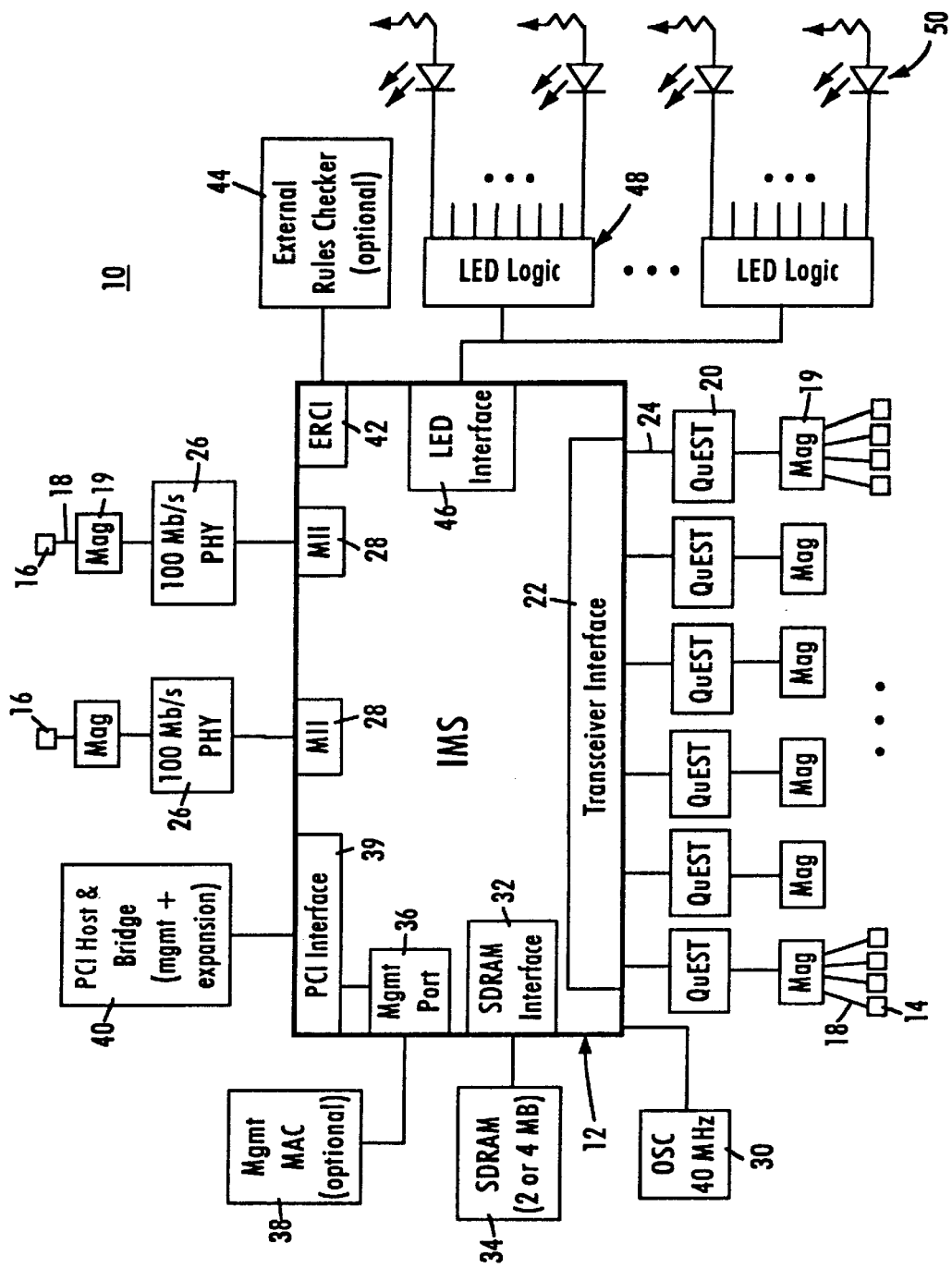
FIG. 1 is a block diagram of a packet switched system environment of the present invention.

The present invention is exemplified herein in a packet switched network environment, such as an Ethernet (IEEE 802.3) network. From the following detailed description it should be apparent that the present invention is also applicable to other packet switched systems. FIG. 1 is a block diagram of a packet switched system 10 which provides the environment of the present invention. The packet switched network includes an integrated multiport switch (IMS) 12 that enables communication of data packets between network stations. The network stations may have different configurations. In the current example, twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20, labelled QuEST, that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets among the Ethernet ports serving the network stations 14 and 16. The multiport switch 12 also includes enhanced functionality to make intelligent switching decisions, and to provide statistical network information in the form of management information base (MIB) objects to an external management entity, as described below. Additional interfaces are provided to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

A management port 36 enables an external management entity to control overall operations of the multiport switch 12 by via management MAC interface 38. PCI interface 39 enables access by the management entity via a PCI host and bridge 40. Alternatively, the PCI host and bridge 40 may serve as an expansion bus for a plurality of IMS devices.

An internal decision making engine, known as a rules checker, within switch 12 selectively transmits data packets received from one source to at least one destination station in accordance with internal mapping of ports and associated stations. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal switching engine or the external rules checker 44.

LED interface 46 clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2:
FIG. 2 is a block diagram of a multiport switch, related to the present invention, that may be used in the packet switched system of FIG. 1.
Figure 2A:
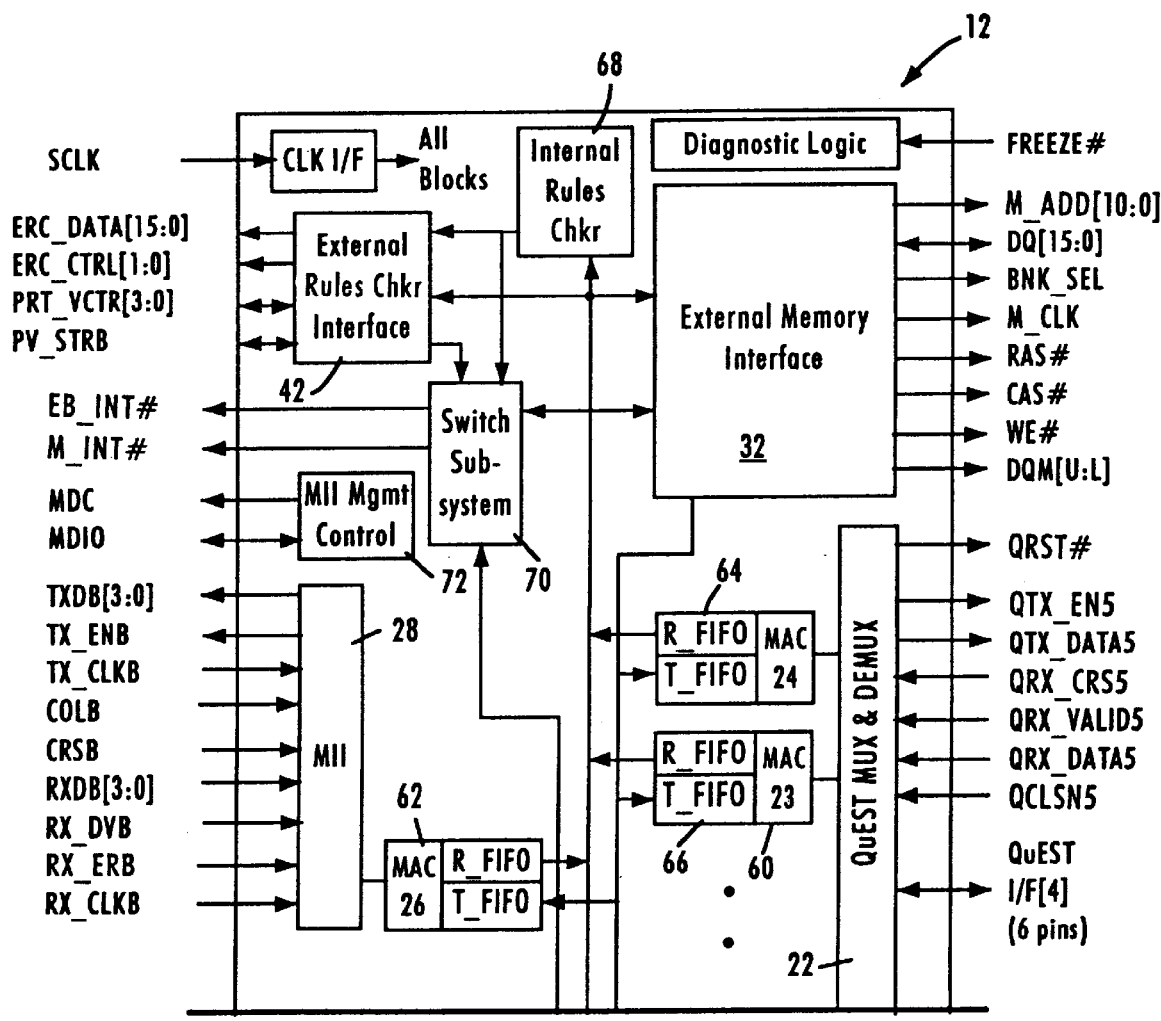
Figure 2B:
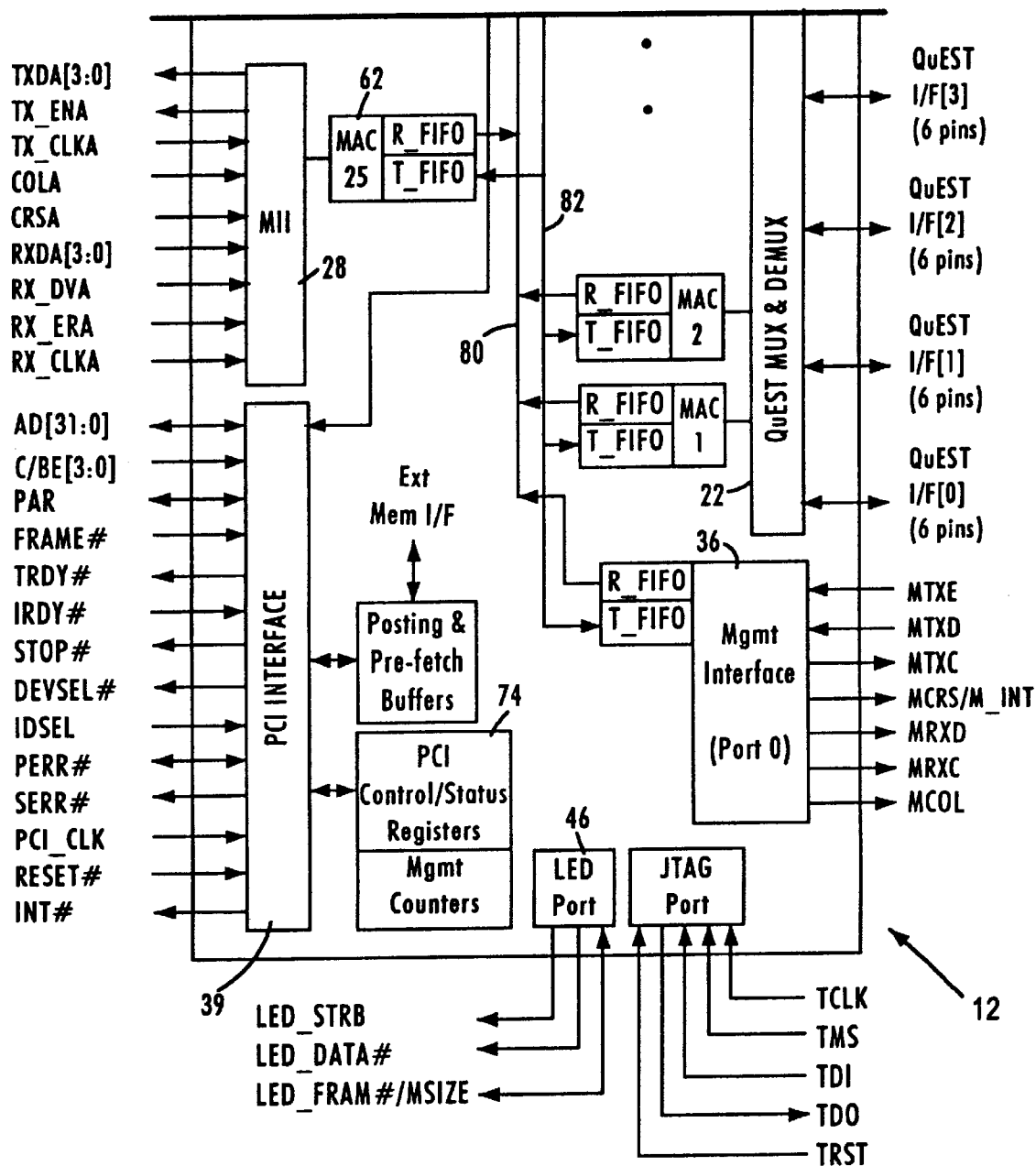

FIG. 2 is a more detailed block diagram of a multiport switch, related to the present invention, that may be used in the packet switched system of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0).

Each of the MAC ports 60, 62 and 36 contains conventional logic and register access control circuitry that enables control of data transmission, data reception, and collision mediation at the port. A receive first-in-first-out (FIFO) buffer 64 and a transmit FIFO buffer 66 are also provided at each port. External memory interface 32 is connected by one common bus to each of the MAC receive FIFO buffers and by another common bus to each of the MAC transmit FIFO buffers.

Data packets from a network station are received by the corresponding MAC port and stored in the corresponding receive FIFO buffer 64. The received data packet is output from the corresponding receive FIFO buffer 64 to the external memory interface 32 for storage in the external memory 34.

The header of the received packet is also forwarded to a decision making engine, comprising an internal rules checker 68 and an external rules checker interface 42, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue that enables frame forwarding decisions to be made before the frame is completely bufferred to external memory, and enables decisions to be made in an order independent from the order in which the frames were received by the multiport switch 12.

The internal rules checker 68 and external rules checker 44 provide the decision making logic for determining the destination MAC port for a given data packet. The decision making engine may indicate that a given data packet is to be output to either a single port, multiple ports, or all ports (i.e., broadcast). Each data packet includes a header having source and destination address, in accordance with which the decision making engine can identify the appropriate output MAC port(s). The destination address may correspond to a virtual address, in which case the decision making engine identifies output ports for a plurality of network stations. Alternatively, a received data packet may include a VLAN (virtual LAN) tagged frame according to IEEE 802.1d protocol that specifies another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface 72 also outputs a management data clock (MDC) providing a timing reference on the bidirectional management data TO (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
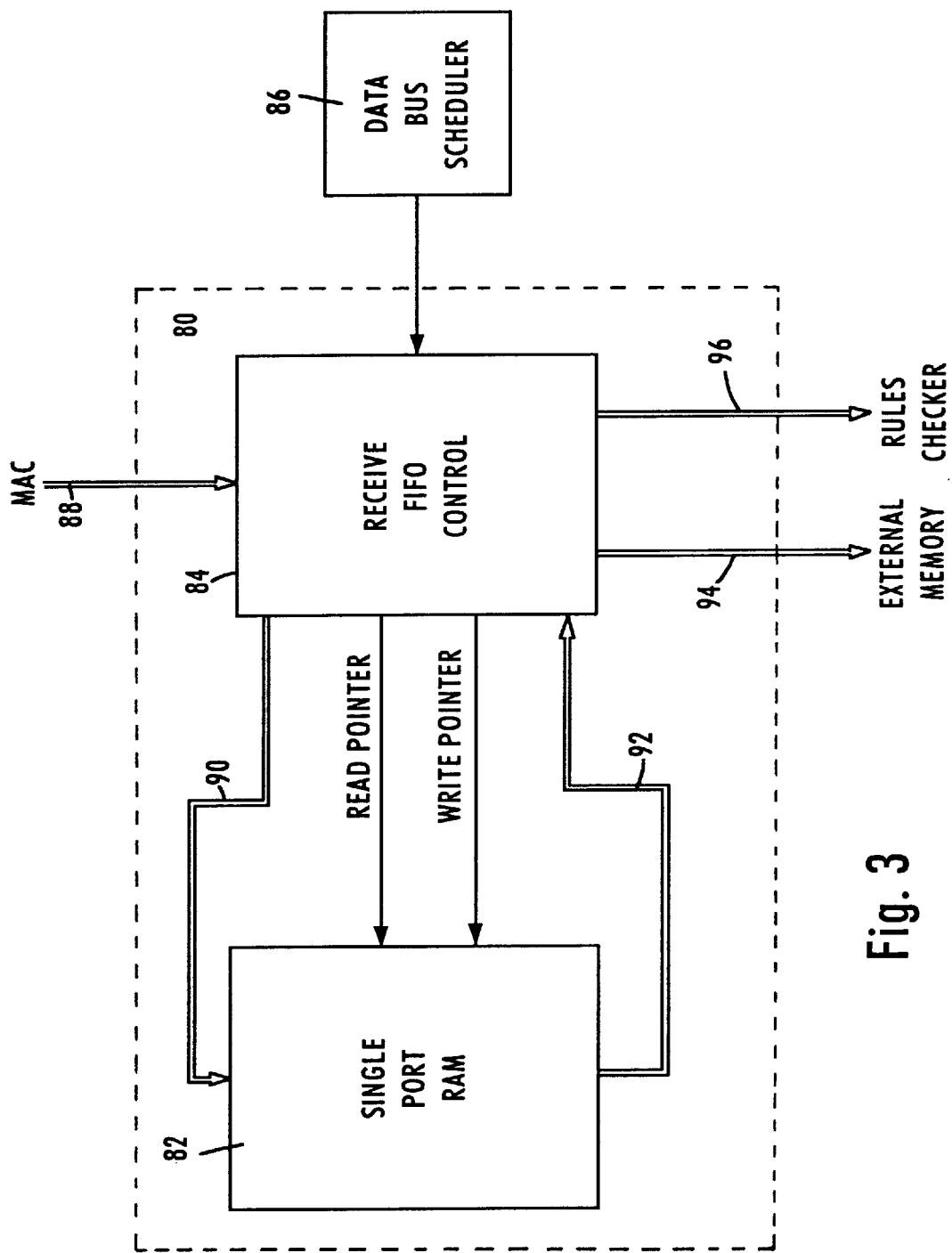
FIG. 3 is a block diagram illustrating a common receive FIFO in accordance with the present invention.

FIG. 3 is a block diagram illustrating a common receive FIFO 80 in accordance with the present invention for the integrated multiport switch system of FIGS. 1 and 2. The FIFO includes a single port RAM 82 for storing incoming communication frame data under control of receive FIFO control block 84. Timed signals are received by the FIFO control from the system data bus scheduler 86. FIFO 80 receives incoming frame data over MAC bus 88. Each MAC port is assigned a time slot corresponding to each cycle of an input clock signal in a complete sequence. In the illustrated embodiment, the clock signal is an 80 Mhz signal. For full utilization of the switch, a continual stream of input data can be transferred over MAC bus 88 from each MAC in sequence to the receive FIFO. The MAC bus is exemplified herein as an 8 bit bus for conveying frame data, nibblewise, one byte at a time from each MAC. The received frame data is written into the single port RAM through FIFO memory input bus 90, a 16 bit bus in this example. The manner in which this process occurs is explained more fully hereinafter. Data is read out from the single port memory and transferred over FIFO memory output bus 92 to the receive FIFO control 84 for transfer to the external memory and rules checker over frame data bus 94 and rules checker bus 96 respectively. In this preferred example, the FIFO memory output bus 92 is a 64 bit bus, and the framed data bus 94 and the rules checker bus 96 are each 16 bit buses. The receive FIFO control, due to the appropriately apportioned bus bit transfer capacities and precise timing signals, governs the transfer of a continual stream of received frame data to the RAM and from the RAM to the external memory and rules checker. The receive FIFO control holds incoming data during cycles in which data is read from the RAM.

Figure 4:
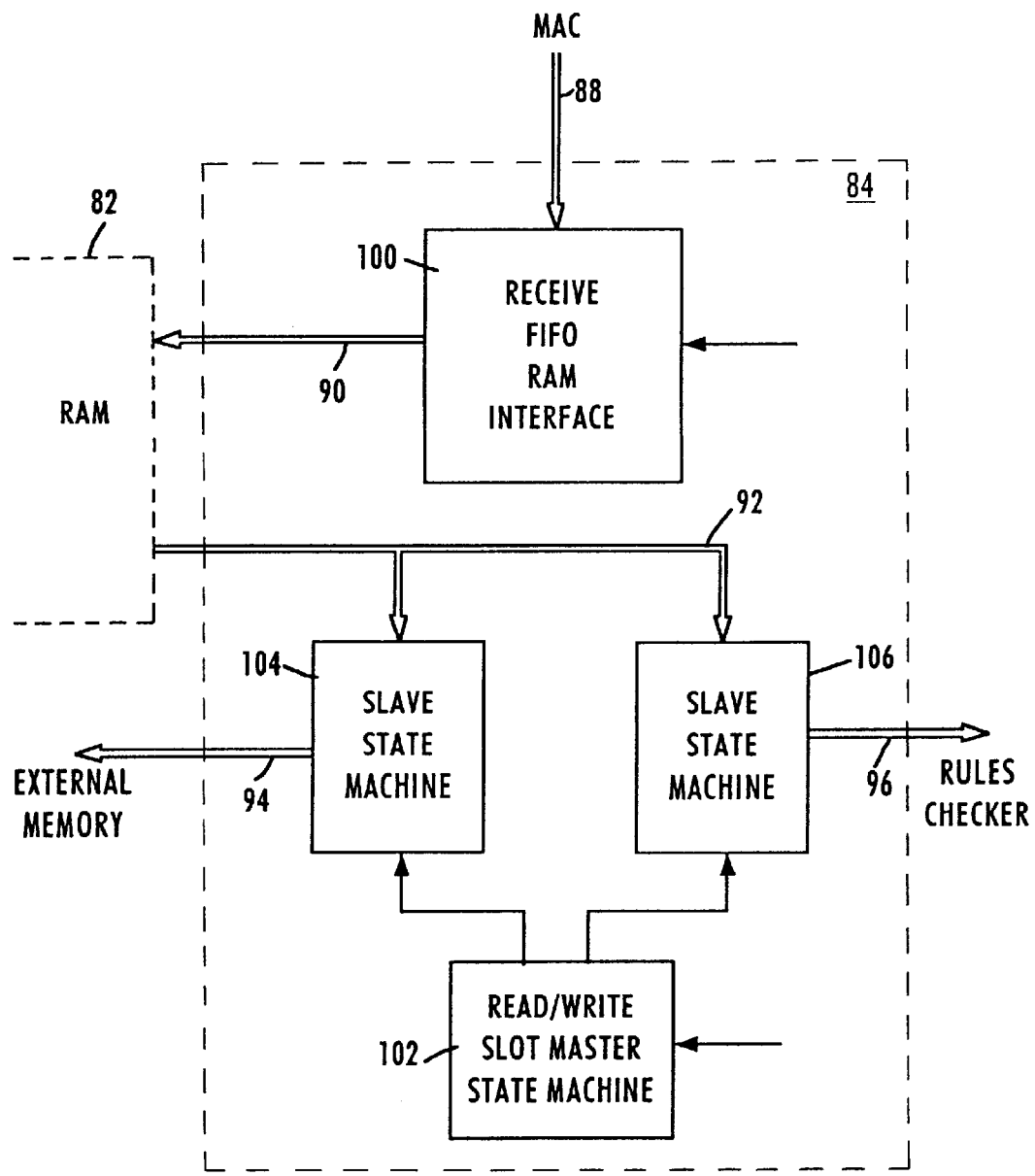
FIG. 4 is a more detailed block diagram of a preferred configuration of the FIFO control shown in FIG. 3.

The FIFO control 84 is shown in more detail in the block diagram of FIG. 4. Receive FIFO RAM interface 100, coupled between the MAC bus 88 and single port RAM 82, governs writing of received data to the RAM over FIFO memory input bus 90. Under control of read/write slot master state machine 102, slave state machine 104 transfers data read out from the RAM to external memory over data bus 94 and slave state machine 106 transfers data read out from the RAM to the rules checker over rules checker bus 96. Data is transferred from RAM 82 to state machines 104 and 106 via FIFO memory output bus 92. Interface 100 and master state machine 102 operate in response to signals received from the system data bus scheduler.

Figure 5:
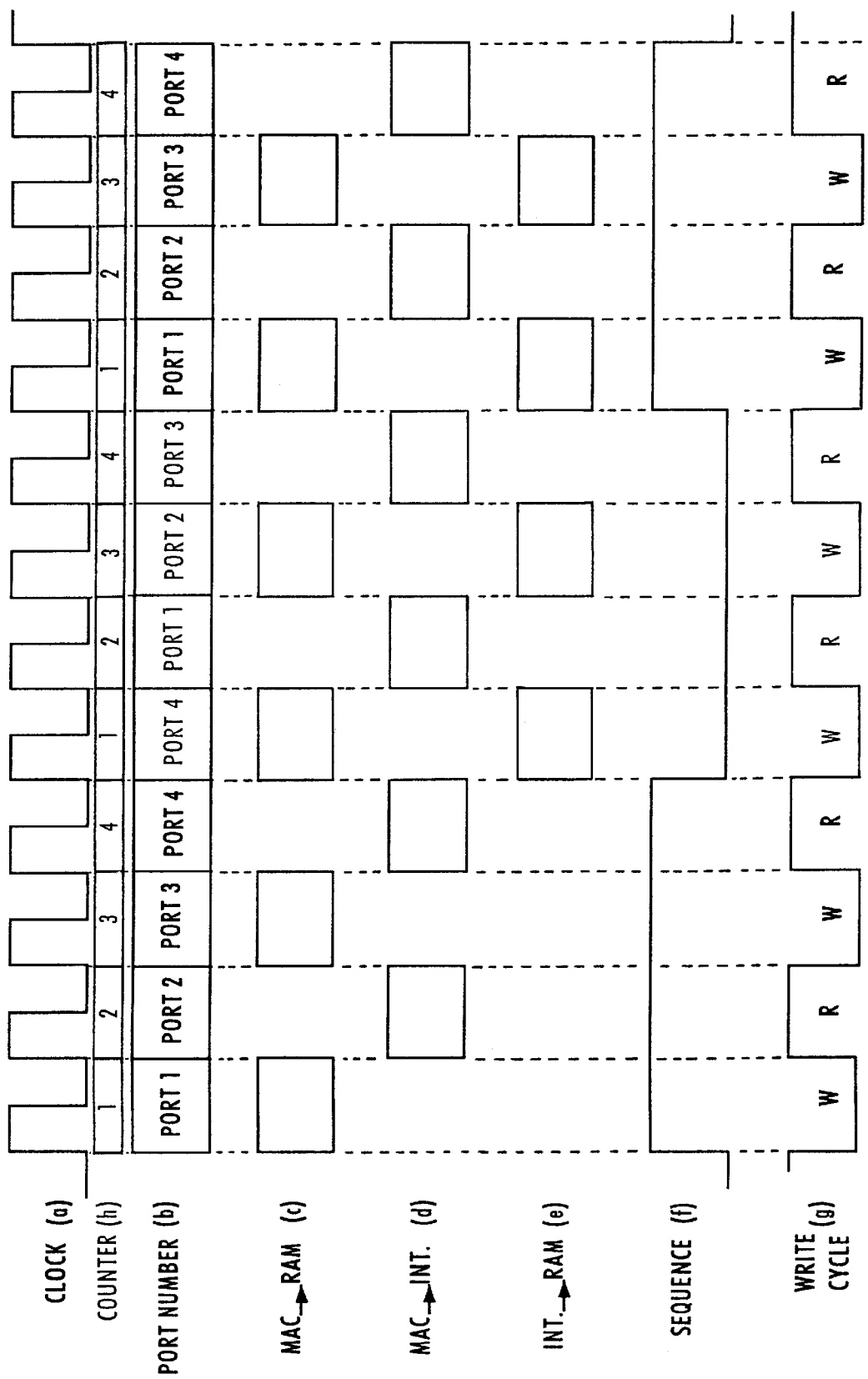
FIG. 5 is waveform diagram illustrating the timing of the receive FIFO operation for writing data to a single port RAM in the FIFO.

Reference is made to the waveform diagrams of FIGS. 5 and 6 in the following description of the operation of the invention. The waveforms of FIG. 5 illustrate data flow interaction among MAC bus 88, receive FIFO RAM interface 100, FIFO memory input bus 90, and single port RAM 82, whereby data is written into the RAM. In the system shown in FIGS. 1 and 2, the invention receive FIFO would be shared by the twenty four MAC ports. For ease of illustration and explanation, FIG. 5 exemplifies a four port switch in which each of the four ports is assigned a time slot in sequence for the clock cycles of the 80 Mhz. clock signal shown in waveform (a) of FIG. 5. Waveform (h) illustrates a repeating four cycle sequence of free running counter. Waveform (b) illustrates a repeating sequence of port time slot assignments which is from port 1 to port 4 when SEQUENCE=1 and from port 4 and ports 1 to 3 when SEQUENCE=$\phi_1$ in successive cycle sequences.

Inasmuch as the FIFO memory is a single port RAM, reading and writing operations cannot occur concurrently. During each complete clock cycle sequence, alternate successive cycles are designated RAM data write cycles, the remaining cycles reserved for read out of RAM data. As incoming data is received continually from the MAC ports, during cycles in which a reading operation of the RAM occurs, incoming data to the FIFO is temporarily buffered in the interface for later transfer to the RAM. Waveform (c) represents transfer of data received from the MAC bus directly to RAM. Waveform (d) represents holding of received data in the interface. Waveform (e) represents transfer of data held in the interface to the RAM. The blocks shown in these waveforms represent eight bits of data received in each cycle from the eight bit MAC bus. Waveform (f) illustrates each complete four slot time sequence of clock cycles as indicated by a change of port number sequence. Waveform (g) designates write cycles (W) and read cycles (R) in alternating polarities.

At the outset, incoming data from the MAC bus is written directly to RAM for ports 1 and 3, i.e., during odd cycles of the sequence, as indicated in waveform (c). Even cycles of this sequence are reserved for RAM reading operations, so that incoming data is held at the FIFO interface, as shown in waveform (d). In order to enable incoming data from all ports to be written to RAM, reservation of slot assignments for writing to and reading from the RAM are reversed in the second sequence with respect to the previous sequence. That is, incoming data from ports 2 and 4 are written directly to RAM and incoming data from ports 1 and 3 are held in the FIFO interface. Waveform (f), which represents consecutive odd and even writing sequence periods, is also illustrative of a signal received by the FIFO interface for setting the write and read cycles.

As FIFO memory input bus in this example is a 16 bit bus that can transfer twice as much data as the MAC bus, during the second sequence data written to RAM includes the eight bit incoming data for the even numbered ports as well as the eight bit data for the even numbered ports held in the interface in the previous sequence. In succeeding sequences, 16 bits of incoming and held data, assuming a fully utilized traffic pattern, will be written in alternate half cycles as indicated in waveform (g). Reversal of read and write cycles occurs for each successive sequence. In this manner, data can be continuously fed to the receive FIFO, while providing for single port RAM readout.

Figure 6:
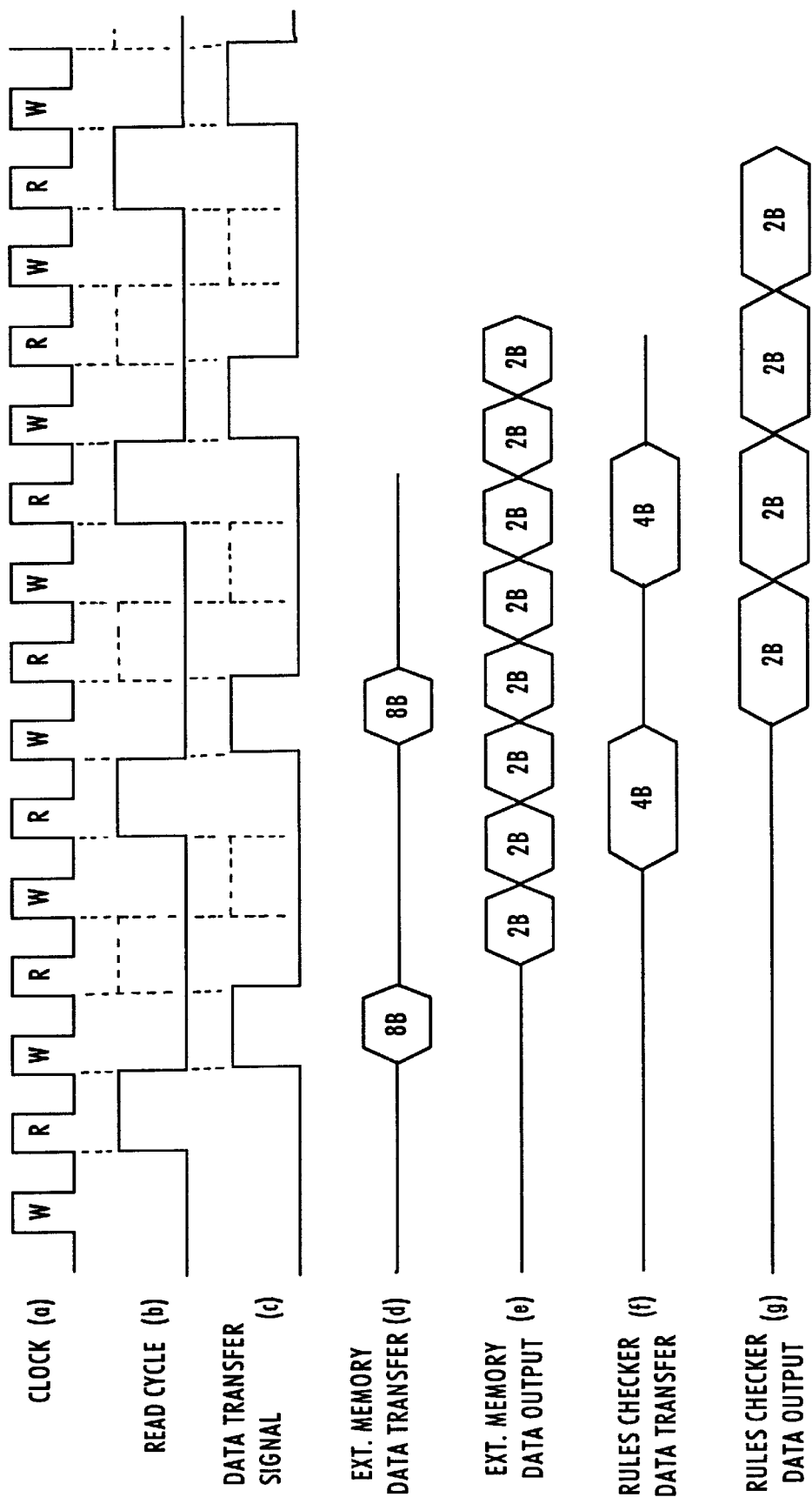
FIG. 6 is waveform diagram illustrating the timing of the receive FIFO operation for reading data from the single port RAM in the FIFO and transfer thereof to external memory and a rules checker.

FIG. 6 contains waveforms that illustrate the read out operations from the RAM and transfer of the read data to the data bus and the rules checker bus. FIFO memory output bus 92 has a sixty four bit transfer capacity. Data is not read out from the RAM to bus 92 until the memory has accumulated a minimum number of received bytes of data. Waveform (a) represents alternate write and read clock cycles for the single port RAM. For purposes of explanation, this waveform represents a large plurality of time slots for a complete sequence and differs in this manner from the four port example illustrated in FIG. 5. In the exemplary embodiment, slave state machine 104 outputs data to the external memory in sixteen byte bursts. Data thus is fed over the sixteen bit data bus 94 in eight two-byte bursts. Slave state machine 106 outputs data to the rules checker in four byte bursts. Since a sixteen bit data bus 96 is used for this purpose, two two-byte bursts of data are transferred.

Waveform (b) represents read signals developed by the read/write slot master state machine 102. The solid line pulses indicate cycles in which data are read from the RAM for transport to the external memory. Dotted line pulses indicate cycles in which data are read from the RAM for transport to the rules checker. As the rules checker requires only header identification information, significantly less frame data is transferred to the rules checker. Waveform (c) represents a signal for indicating cycles in which the data read from the RAM are transferred to the respective slave state machines 104 and 106. This signal issues the transfer commands in the cycles immediately following the read cycles. Waveform (d) indicates data transfers in eight byte amounts over the sixty four bit FIFO memory output bus 92 to slave state machine 104. Waveform (e) indicates outputs of two bytes of the eight transferred bytes over the 16 bit data bus 94 in bursts over the next four clock cycles. In the fourth cycle another eight bytes of data are transferred to the slave state machine 104 for output to the external memory in two byte increments in the following four clock cycles.

Transfers of the four bytes of data to the slave state machine 106 occur between the cycles in which data for external memory is transferred. Since less data transfer is required, the 80 Mhz. clock frequency is divided in half for the timing of data output to the rules checker. As shown in waveforms (f) and (g), four byte data transfers occur during periods of two 80 Mhz. cycles, to be output in two two-byte bursts over the following four 80 Mhz. clock cycles.

As can be appreciated from the above description, the present invention provides for continuous application of received port data to a commonly used receive FIFO having a single port RAM while concurrently reading data from the RAM during alternate clock cycles. In addition, data read from the RAM are concurrently transferred to both external memory and a rules checker at different switch locations. The present invention thus advantageously provides efficient use of the receive FIFO while conserving chip architecture. Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. In an integrated multiport network switch having a plurality of ports for interfacing with a data network to permit data communication through said ports among a plurality of remote stations coupled to said data network, a first-in-first-out (FIFO) structure comprising:
   a single port random access memory (RAM) for storing network communication data received from each of said ports;
   a FIFO control unit coupled to a media access control (MAC) for each port by a MAC bus and by a FIFO memory input bus to said RAM for controlling on a time shared basis, writing of data received from each port via said MAC bus to said RAM, said FIFO control unit being coupled to said RAM by a FIFO memory output bus for transferring data read from said RAM;
   wherein said FIFO control unit comprises an input connection to a data bus scheduler in said switch for activating FIFO control unit functions in response to a clock signal; and
   wherein said FIFO control unit functions comprise transferring received data directly to said RAM, holding received data before being transferred to said RAM, transferring data from said RAM to external memory, and transferring data from said RAM to a rules checker.

2. An arrangement as recited in claim 1, wherein said FIFO memory input bus has a larger bit transfer capacity than said MAC bus.

3. In an integrated multiport network switch having a plurality of ports for interfacing with a data network to permit data communication through said ports among a plurality of remote stations coupled to said data network, a first-in-first-out (FIFO) structure comprising:
   a single port random access memory (RAM) for storing network communication data received from each of said ports;
   a FIFO control unit coupled to a media access control (MAC) for each port by a MAC bus and by a FIFO memory input bus to said RAM for controlling, on a time shared basis, writing of data received from each port via said MAC bus to said RAM, said FIFO control unit being coupled to said RAM by a FIFO memory output bus for transferring data read from said RAM;
   wherein said FIFO control unit further comprises a receive RAM interface connected to said MAC bus for receiving communication data from said ports and to said FIFO memory input bus for transferring communication to said RAM for storage; and
   wherein said FIFO control unit further comprises:
   a first slave state machine coupled between said FIFO memory output bus and a data bus for transferring data from said RAM to a memory external to said switch; and
   a second slave state machine coupled between said FIFO output bus and a rules checker bus for transferring data from said RAM to a rules checker.

4. An arrangement as recited in claim 3, wherein said FIFO output bus has a larger bit transfer capacity than said data bus and said rules checker bus.

5. An arrangement as recited in claim 1, wherein said MAC comprises circuitry at each of said ports.

6. An arrangement as recited in claim 1, wherein said MAC comprises time-shared circuitry common to all of said ports.

7. In a multiport integrated network switch having a plurality of switch ports coupled to a data network to route data communication among a plurality of remote stations connected to said data network, a method for controlling transfer of data received at each of said ports from the network, comprising the steps of:
   applying network communication data received at each port in timed sequence to a first-in-first-out (FIFO) structure in said switch in successive cycles of a clock signal;
   writing the data applied in said applying step to a memory in said FIFO structure during alternate successive cycles of said clock signal;
   holding the data applied in said applying step in a FIFO interface during clock cycles that occur between said alternate successive cycles; and
   reading data from said memory during the cycles in which said holding step occurs;
   wherein said applying step further comprises allocating the data received at each port to a respective clock signal cycle as a dedicated port time slot in an initial complete sequence of successive clock cycles for all of said ports, whereby data received from approximate half of said plurality of ports are written to said memory and the data received from the remainder of said plurality of ports are held during each said complete sequence; and
   wherein said applying step further occurs repeatedly in subsequent complete sequences of successive clock cycles for all of said ports; and during the first subsequent complete sequence, said writing step further comprises, in alternate cycles, writing data received from the ports for which the holding step occurred in said initial complete sequence, and said holding step further comprises holding data received from the ports for which the writing step occurred in said initial complete sequence in the remaining cycles.

8. A method as recited in claim 7, wherein said writing step further comprises writing data that was held in said holding step in the initial complete sequence together with received data during said first subsequent complete sequence.

9. In a multiport integrated network switch having a plurality of switch ports coupled to a data network to route data communication among a plurality of remote stations connected to said data network, a method for controlling transfer of data received at each of said ports from the network, comprising the steps of:

applying network communication data received at each port in timed sequence to a first-in-first-out (FIFO) structure in said switch in successive cycles of a clock signal;

writing the data applied in said applying step to a memory in said FIFO structure during alternate successive cycles of said clock signal;

holding the data applied in said applying step in a FIFO interface during clock cycles that occur between said alternate successive cycles; and reading data from said memory during the cycles in which said holding step occurs;

wherein said reading step comprises alternately transferring data from said RAM respectively to first and second slave state machines in said FIFO structure, and further comprising the steps of:

outputting the data transferred to said first slave machine in a reading cycle, in bursts in a plurality of successive cycles subsequent to said reading cycle, to a memory external to said switch; and outputting the data transferred to said second slave machine in an alternate reading cycle, in bursts in a plurality of successive cycles subsequent to said alternate reading cycle, to a switch rules checker.

\* \* \* \* \*